United States Patent [19]

Kameya

[11] Patent Number: 4,697,162
[45] Date of Patent: Sep. 29, 1987

[54] VARIABLE DELAY LINE SYSTEM
[75] Inventor: Kazuo Kameya, Tsurugashima, Japan
[73] Assignee: Elmec Corporation, Saitama, Japan
[21] Appl. No.: 826,374
[22] Filed: Feb. 5, 1986
[51] Int. Cl.[4] .......................... H01P 9/00; H01P 3/08; H03H 7/34
[52] U.S. Cl. .................................... 333/161; 333/139; 333/140; 333/246
[58] Field of Search .............. 333/161, 162, 156, 157, 333/138, 139, 140, 159, 246

[56] References Cited

U.S. PATENT DOCUMENTS 1,641,432  9/1927  Hubbard ........................... 333/138
3,601,684  8/1971  Earp et al. ..................... 333/161 X
3,768,046  10/1973  Lorber et al. ..................... 333/166

FOREIGN PATENT DOCUMENTS 0145211  8/1983  Japan ................................. 333/139

OTHER PUBLICATIONS

"Constant Delay Lines", data sheet No. 102 (V Series Variable Delay Lines), Control Electronics, Huntington Station, L.I., N.Y., Received U.S. Patent Office Mar. 25, 1959; 4 pages.

Primary Examiner—Marvin L. Nussbaum
Attorney, Agent, or Firm—Wegner & Bretschneider

[57] ABSTRACT

This variable delay line system includes a variable delay line which has two output ends and a plurality of signal input points at its intermediate points, a means for selecting one of the input points of the variable delay line and for inputting a signal thereto, and a means for switching the signals from the output ends of the variable delay line and for outputting them. Optionally, a fixed delay line can further be included. Thereby, the varibale delay line system has a simple and compact structure and is effective.

12 Claims, 8 Drawing Figures

VARIABLE DELAY LINE SYSTEM

BACKGROUND OF THE INVENTION

The present invention relates to the field of electromagnetic delay lines, and more specifically relates to an electromagnetic delay line system which is variable, which can switchably output a plurality of signals with different delay times from a single input signal, and which can vary the differences between the delay times of said output signals.

Conventionally, in order to provide such a variable type of delay line system, it has, for instance, been practiced to input the input signal into a first signal line and also into a second signal line having a variable delay line, and to selectively produce signals with different delay times by selectively switching between the first and the second signal lines, while the difference between the delay times of the output signals is made variable by varying the delay time of the variable delay line.

However, according to such a prior art type variable delay line system, the difference between the delay times of the output signals can be adjusted only to the extent of the variability of the variable delay line. It a large delay time difference is required to be obtained by such adjustment, it is necessary to use a variable delay line which has a large maximum delay time, and therefore the variable delay line system tends to become large in size and costly.

SUMMARY OF THE INVENTION

Accordingly, it is the primary object of the present invention to provide a variable delay line system, which avoids the above described problems.

It is a further object of the present invention to provide such a variable delay line system, which can provide a large variation in delay time.

It is a further object of the present invention to provide such a variable delay line system, which is able to provide a larger range of variation in delay time than is able to be provided only by a delay line incorporated therein by itself.

It is a yet further object of the present invention to provide such a variable delay line system, which is able to provide substantially continuous variation of delay time.

It is a yet further object of the present invention to provide such a variable delay line system, which is able to provide stepwise variation of delay time.

It is a yet further object of the present invention to provide such a variable delay line system, which is compact.

It is a yet further object of the present invention to provide such a variable delay line system, which is simply in structure.

It is a yet further object of the present invention to provide such a variable delay line system, the dealy time of which is digitally controllable.

According to the present invention, these and other objects are accomplished by a variable delay line system, comprising: a variable delay line comprising two output ends and a plurality of signal input points at intermediate points thereof; a means for selecting one of said input points of said variable delay line and for inputting a signal thereto; and a means for switching the signals from said output ends of said variable delay line and for outputting them; or, according to another aspect therof, by a variable delay line system, comprising: a variable delay line comprising two output ends and a plurality of signal input points at intermediate points thereof; a means for selecting one of said input points of said variable delay line and for inputting a signal thereto; a fixed delay line which is connected in series with one of said output ends of said variable delay line; and a means for switching the signals from the other output end of said variable delay line and said output end of said fixed delay line and for outputting them.

According to the present invention, the input signal is inputted into an intermediate point of the variable delay line and is selectively switched over. As the point of inputting this signal into the variable delay line is moved along said variable delay line by the input point selection means, the delay time of the signal produced at one of the output ends of the variable delay line increases while the other decreases. Therefore, the difference of delay times between the two output signals can be brought to be about twice the absolute delay time variation produced by the displacement of the input point on just one of those signals. And the addition of the fixed delay line further improves the characteristics of the device, as will become clear from the following descriptions.

BRIEF DESCRIPTION OF THE DRAWINGS

In the appended drawings, which should not be considered as limitative but only illustrative.

DESCRIPTION OF THE PREFERRED EMBODIMENTS

Figure 1:
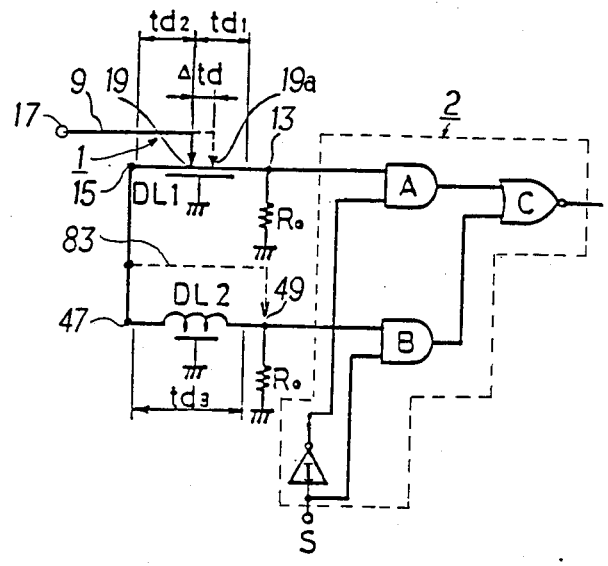
FIG. 1 is a circuit diagram for the first preferred embodiment of the variable delay line system of the present invention.

The present invention will now be described in detail in terms of the preferred embodiments thereof. FIG. 1 is a circuit diagram showing the electrical structure of the first preferred embodiment of the variable delay line system present invention. As shown in this figure, the variable delay line structure generally comprises a variable delay line DL1 having a plurality of input points, an input point selection device 1 for selecting between these input points, a fixed delay line DL2 which is connected in series with the variable delay line DL1, and a signal switching device 2 which is connected both to the variable delay line DL1 and also to the fixed delay line DL2.

As particularly shown in FIGS. 2 and 3, the variable delay line DL1 comprises a base board 3 made of insulating material which serves as a dielectric layer as will be seen hereinafter, an electroconductive strip 5 formed on one side of this base board 3, and a ground plane 7 formed on the other side of this base board 3 as opposing the electroconductive strip 5, so as to form a distributed constant type delay line of a microstrip structure.

Further, the input point selection device 1 comprises a strip shaped input circuit 9 formed on the same side of the base board 3 as the electroconductive strip 5 and opposing said electroconductive strip 5 and parallel thereto with a certain gap D being left therebetween, and a connecting piece 11 bridging between the input circuit 9 and the electroconductive strip 5. This connecting piece 11 is soldered at its ends to the intermediate portions of the input circuit 9 and the electroconductive strip 5 with which it is contacted, although this is not particularly shown in the drawings. The portion of the ground plane 7 opposing the input circuit 9 is cut away. The distance D between the electroconductive strip 5 and the input circuit 9 is so selected as to avoid any erroneous action due to distortion in the waveform arising from unnecessary coupling.

One end of the electroconductive strip 5 is cranked around and serves as a first output end 13, and similarly the other end of said electroconductive strip 5 is also cranked around and serves as a second output end 15. And one end of the input circuit 9 of the input selection device 1 is cranked around and serves as a first input end 17, while on the other hand the other end of said input circuit 9 is free and not connected to anything.

In this variable delay line DL1, the connection point between the electroconductive strip 5 and the connecting piece 11 serves as an input point 19 for signals, and, by changing the position along said electroconductive strip 5 to which the connecting piece 11 is soldered, thus moving the input point 19. the line lengths between said input point 19 and the first and the second output ends 13 and 15 are altered, and accordingly the delay times of the output signals are varied.

As shown in the circuit diagram of FIG. 1, the first output end 13 of this variable delay line DL1 is connected to one of the inputs of a two input AND gate A incorporated in the signal switching device 2, while the second output end 15 of the variable delay line DL1 is connected in series to the fixed delay line DL2 which has a delay time of $td_3$.

Figure 4:
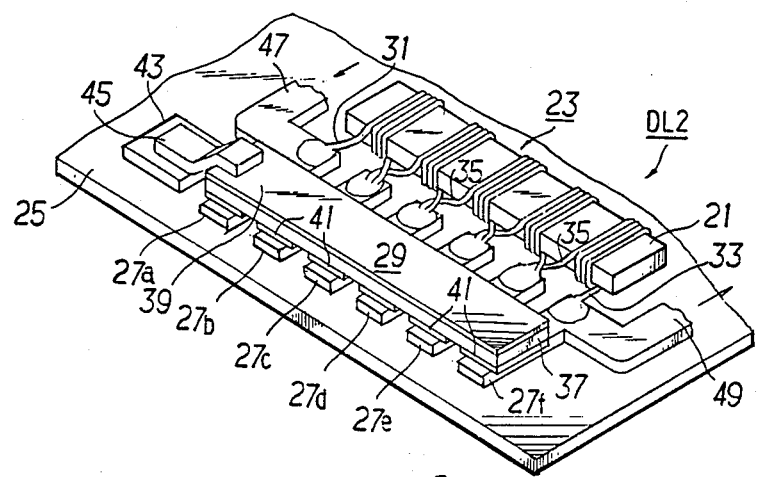
FIG. 4 is a perspective view of a fixed delay line incorporated in said first preferred embodiment.

The fixed delay line DL2, shown in perspective view in FIG. 4, comprises an insulating base board 25, a coil 23 formed on an elongated bobbin 21, and a composite capacitor 29 connected to the coil 23 via a plurality of intermediate electrodes 27a through 27f formed on the insulating base board 25; thus, this fixed delay line DL2 has a lumped constant type structure.

In detail, this coil 23 is formed by winding a number of turns of electroconductive wire around the bobbin 21 in the form of a single layered solenoid, defining the leads at the ends as input and output leads 31 and 33, and bringing out intermediate taps 35 for every certain number of turns along with said input and output leads 31 and 33. The runs of the wire on either side of each of the intermediate taps 35 are spaced apart from one another by a certain distance. The input and the output leads 31 and 33 and the intermediate taps 35 are soldered to the one ends of six (in this first preferred embodiment) rectangular intermediate electrodes 27a through 27f, which are fitted to the base board 25 in parallel.

A composite capacitor 29 is formed by forming a ground electrode 39 over the whole of one surface of a flat and elongated dielectric plate 37, and by forming capacitor electrodes 41 on the opposite surface of the dielectric plate 37 at the same pitch as the intermediate electrodes 27a through 27f. These capacitor electrodes 41 are soldered to the intermediate electrodes 27a through 27f so as to be connected to the coil 23. In FIG. 4, the reference numeral 43 denotes a ground side intermediate electrode formed on the base board 25, while 45 is a connection piece connecting the ground plane 39 of the composite capacitor 29 with the ground side intermediate electrode 43.

Figure 2:
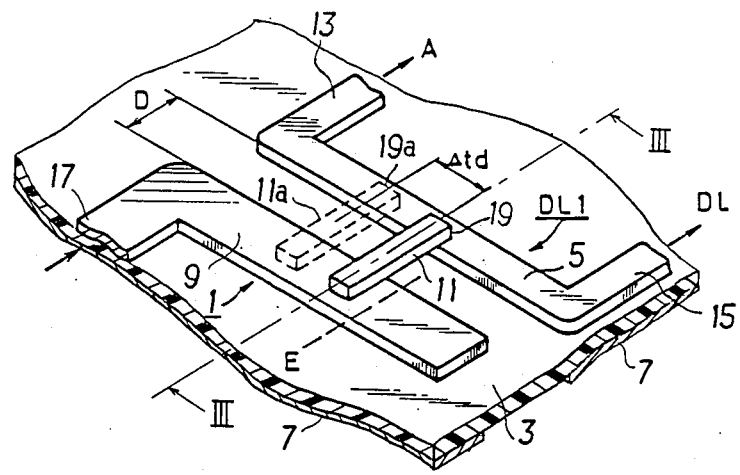
FIG. 2 is a perspective view showing the concrete structures of a variable delay line and of an input point selection device incorporated in the same.
Figure 3:
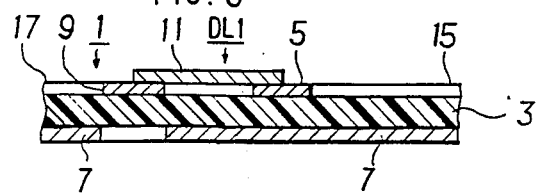
FIG. 3 is a section through the structures of FIG. 2, taken in a plane indicated by the arrows III—III in FIG. 2.

The base board 25 of this fixed delay line DL2 may be continuous with the base board 3 of the variable delay line DL1, shown in FIG. 2.

In this fixed delay line DL2, the one 27a of the intermediate electrodes 27a through 27f which is on one end of the row thereof serves as an input point 47 and is connected to the second output end 15 of the variable delay line DL1, while the one 27f of said intermediate electrodes 27a through 27f which is on the other end of the row thereof serves as an output point 49 and is connected to one of the inputs of a two input AND gate B of the signal switching device 2 of FIG. 1.

Between the first output end 13 of the variable delay line DL1 and the output end 49 of the fixed delay line DL2, and ground, resistors Ro having substantially the same impedance as the variable delay line DL1 and the fixed delay line DL2, respectively, are provided; and, since the impedance at the input point 19 of the variable delay line DL1 is Ro/2, it is preferable to use a resistor likewise having resistance Ro/2 in the input circuit 9. To this end, as shown in FIG. 2 and mentioned above, it is preferable to eliminate the portion of the ground plane 7 on the base board 3 which opposes the input circuit 9. The other input of the AND gate A of the signal switching device 2 receives a digital control signal s via an invertor I, while the other input of the AND gate B receives said digital control signal s directly. And the outputs of the two AND gates A and B are connected to the inputs of a two input NOR gate C, the output of which is connected to a circuit of a succeeding stage.

Now, the action of this first preferred embodiment will be described.

In the variable delay line DL1, if the delay time from the input point 19 (when the connection piece 11 is positioned as shown by the solid lines in the drawing) to the first output end 13 is denoted as $td_1$, while the delay time from said input point 19 to the second output end 15 is denoted as $td_2$, then there is a time delay of $td_1$ from the input point 19 to the AND gate A, and there is a time delay of $td_2+td_3$ from the input point 19 to the AND gate B. The sum of $td_1$ and $td_2$ is the range of adjustment.

Here, if the level of the digital signal S is high, then the output signal of the fixed delay line DL2 is outputted from the AND gate B, while, if the level of the digital signal S is low, then the output signal of the variable delay line DL1 is outputted from the AND gate A. In either case said output signal is outputted from the NOR gate C.

If the propagation delay times of the AND gates A and B are assumed to be identical, then the difference in delay time TDn between the cases of high and low level of the digital signals S will be $TDn = td_2 + td_3 - td_1$.

If the connection piece 11 of FIG. 2 is displaced through a distance of $\Delta td$ towards the first output end 13 to the position shown as 11a and as indicated by the broken lines in the drawing, so that the input point is now as shown by 19a, then there will be a delay time of $td_1 - \Delta td$ between the input point 19a and the AND gate A, and a delay time of $td_2 + \Delta td + td_3$ between the input point 19a and the AND gate B. Therefore the delay time difference $TDn'$ is:

$$TDn' = (td_2 + \Delta td + td_3) - (td_1 - \Delta td) = (td_2 + td_3) - td_1 + 2\Delta td = TDn + 2\Delta td \quad \text{EQUATION (1)}$$

In other words, in the variable delay line DL1, by changing the delay time difference between the input point 19 and the first output end 13 by $\Delta td$, the difference in delay time between the output signals from the first output end 13 of the variable delay line DL1 and the fixed delay line DL2 will be $2\Delta td$. Therefore, even when the range of adjustment in the variable delay line DL1 is $td_1 + td_2$, it is possible to achieve the adjustment of the delay time difference over the range of $2\Delta td$, in effect. For example, if the variable delay line DL1, which exemplarily may utilize fluoride resin for its base board 3, has a delay time of approximately 50 ps per cm, then it is possible to achieve an adjustment of delay time difference of approximately 100 ps per cm by moving the connection piece 11, and a substantial increase of the range of delay time difference is thus obtained.

In adjusting the delay time difference of the variable delay line DL1, it becomes easier to obtain impedance matching if the open end side of the input circuit 9 is cut off as shown by the broken line E in FIG. 2, after the connecting piece 11 is fixed.

Figure 5:
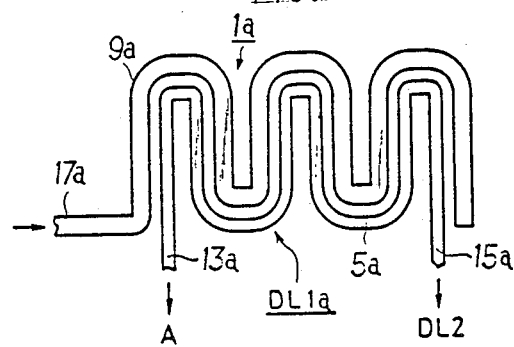
FIG. 5 is a schematic plan view showing a variable delay line and an input point selection device of a second preferred embodiment of the present invention.

In FIG. 5, there are shown in schematic plan view the variable delay line DL1a and the input point selection device of a second preferred embodiment of the present invention. This variable delay line DL1a is made by convoluting an electroconductive strip 5a into a zigzag shape, and an input point selection device 1a is formed by using an input circuit 9a which is formed similarly to an extends beside and somewhat spaced away from the electroconductive strip 5a. The reference symbol 17a denotes an input end of the input circuit 9a, while the symbols 13a and 15a denote first and second output ends thereof. The connection piece which bridges between the electroconductive strip 5a and the input circuit 9a is not particularly shown in the figure, but is like the connection piece 11 of the first preferred embodiment shown in FIG. 2, while the electroconductive strip 5a and the input circuit 9a are likewise formed on one side of a base board like the base board 3 of the first preferred embodiment, a ground plane (not particularly shown either) being formed on the other side of said base board from the electroconductive strip 5a, in a similar way to that shown in FIG. 2 for the first preferred embodiment.

Thus, it is seen that the variable delay line and the input point selection device of the variable delay line system of the present invention are not limited to being formed from a linear electroconductive strip 5a and input circuit 9a. By using a curved and/or bent electroconductive strip 5a and input circuit 9a, the line length of the electroconductive strip 5a can be increased, without increasing the overall size of the device, and a broader range of adjustment of the time difference will become possible.

In the above described first and second preferred embodiments, the variable delay lines DL1 and DL1a were of the distributed constant type structure with a microstrip line structure, and the input point was able to be set substantially anywhere along the microstrip line; so the output time difference could be continuously varied by moving the connecting piece 11.

Figure 6:
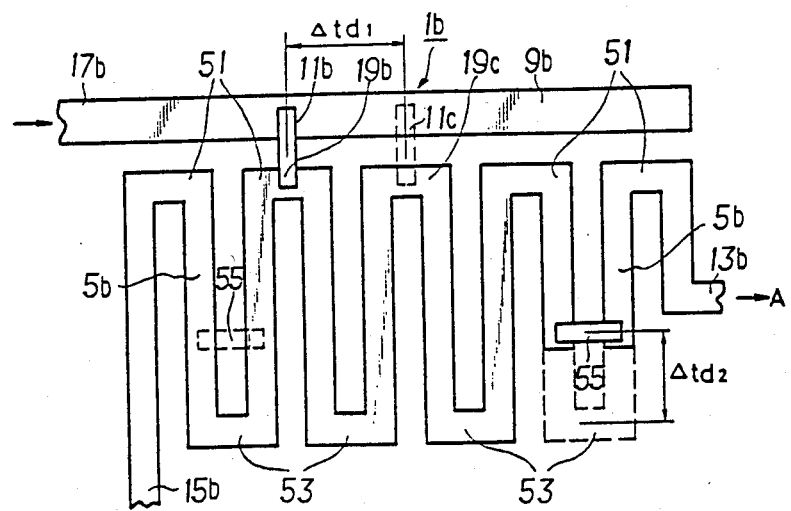
FIG. 6 is a schematic plan view showing a third preferred embodiment of the present invention.

In FIG. 6, there is shown a schematic plan view of a third preferred embodiment of the variable delay line system of the present invention. Here, a variable delay line DL1b is formed by using a bent electroconductive strip 5b which is formed by sequentially bending an electroconductive strip into a sequence of linked part rectangular shapes, i.e. so as to zigzag to and fro by being bent through a sequence of opposite pairs of right angle bends, with thus a plurality of mutually parallel longer run portions being defined and being joined in series by two sets of shorter mutually in line portions 51 and 53. And an input point selection device 1b is formed by connecting an input circuit 9b which is formed as linearly extending along one of the sets of in line portions 51 to a point on one of said in line portions 51 by a connecting piece 11b. The reference numerals 13b and 15b denote the first and the second output ends of this variable delay line DL1b, and the remainder of the structure is similar to that of the first preferred embodiment as shown in FIG. 2, with the electroconductive strip 5b and the input circuit 9b being formed on the one side of a base board, and with the ground plane being formed opposite to said electroconductive strip 5b.

Further, in this zigzag shaped electroconductive strip 5b, a short circuiting piece 55 is fixed to bridge between two opposing points on two adjacent ones of the longer parallel run portions, thus short circuiting said two longer run portions together. The fixing of this short circuiting piece 55 may again be performed by soldering or the like, and the position thereof may of course be set appropriately.

With the thus structured variable delay line DL1b, suppose that the delay time between one of the shorter in line portions 51 to the next one thereof is $\Delta td_1$. Then, by moving the connection piece 11b to the next said in line portion 51, thus to be positioned as the connection piece 11c shown by broken lines in FIG. 6, and then moving it sequentially onward through said in line portions 51, the delay time of the output signal can be changed by sequential steps of $\Delta td_1$.

Meanwhile, if the short circuiting piece 55 is moved by $\Delta td_2$, then the delay time from the input point 19b to the first output end 13b (for instance) of the variable delay line DL1b will change by $2\Delta td_2$. And, by moving the short circuiting piece 55 from the vicinity of the other said set of in line portions 53 to the vicinity of said set of in line portions 51, the delay time difference can be changed from zero to $\Delta td_1$. Therefore, if there are m bends in the bent zigzag shaped electroconductive strip 5b, it is possible to have the range of delay time difference provided thereby between the input point 19b and the first output end 13b and between the input point 19b and the second output end 15b alter through a total amount of from zero to $m\Delta td_1$. Further, there will be a great delay time difference of from zero to $m\Delta td_1$ between the output signals of the first output end 13b and the second output end 15b.

Therefore, by using motion of the connection piece 11b between the in line portions 51 for providing coarse adjustment of delay time difference, and by using motion of the short circuiting piece 55 along the longer parallel run portions of the zigzag shaped electroconductive strip 5b for providing fine adjustment thereof, and by further making sure that the steps of delay time difference caused by moving the connection piece 11b between adjacent ones of the in line portions 51 can be covered either by the positive or the negative side of the fine adjustment range of from zero to plus or minus $\Delta td_1$, it is possible to obtain a delay time variation of from zero to $2m\Delta td_1$ between the output signals of the first output end 13b and the second output end 15b. However, if the connection piece 55 is used from the input point 19b to each of the first output end 13b and the second output end 15b, no such considerations will be necessary.

Furthermore, in such a delay line using a bent zigzag shaped electroconductive strip, since a larger portion of the bent electroconductive strip 5b is relatively far removed from the input circuit 9b, the coupling between said input circuit 9b and the bent electroconductive strip 5b is in practive negligible, and there will be less likelihood of waveform distortion or other problems arising.

It should be understood that, according to this particular aspect of the present invention, the form of the bent zigzag shaped electroconductive strip 5b is not limited to being a rectangular one with right angled bends; in fact, said electroconductive strip 5b may have a V shaped zigzag configuration, or some other repetitive and tortuous configuration.

Figure 7:
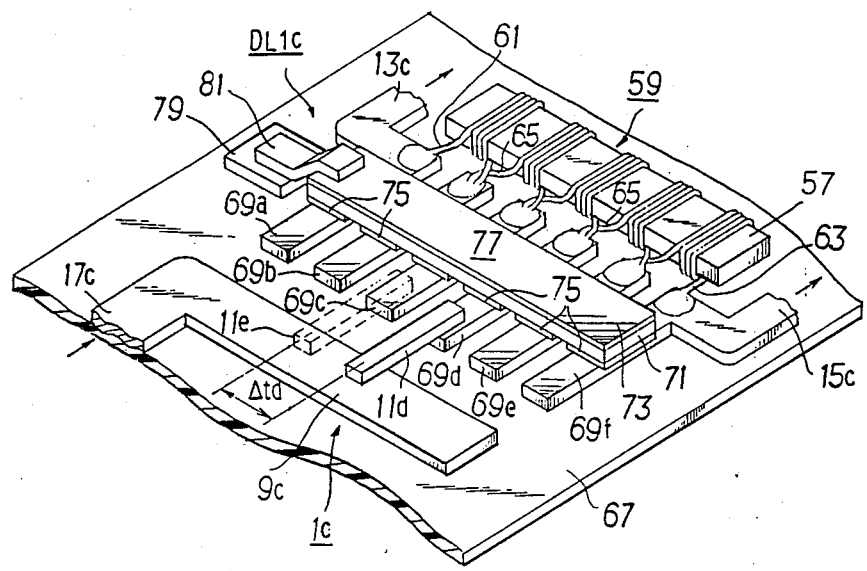
FIG. 7 is a schematic perspective view of a variable delay line and an input point selection device incorporated in a fourth preferred embodiment of the present invention.

In FIG. 7, there is shown a schematic perspective view of a variable delay line DL1c and an input point selection device incorporated in the fourth preferred embodiment of the variable delay line system of the present invention. Here, the variable delay line is of the lumped constant type, as opposed to the variable delay lines DL1, DL1a, and DL1b of the previous embodiments which were of the distributed constant type.

A coil 59 is formed by winding a number of turns of electroconductive wire around an elongated planar insulating bobbin 57 in the form of a single layered solenoid, defining the leads at the ends as input and output leads 61 and 63, and bringing out intermediate taps 65 for every certain number of turns along with the input and output leads 61 and 63. The runs of the wire on either side of each of the intermediate taps 65 are spaced apart from one another by a certain distance. The input and the output leads 61 and 63 and the intermediate taps 65 are soldered to the one ends of six rectangular intermediate electrodes 69a through 69f, which are fitted to a base board 67 in parallel.

A composite capacitor 77 is formed by forming a ground electrode 73 over the whole of one surface of a flat and elongated dielectric plate 71, and by forming capacitor electrodes 75 on the opposite surface of said dielectric plate 71 at the same pitch as the intermediate electrodes 69a through 69f. These capacitor electrodes 75 are soldered to the intermediate electrodes 69a through 69f so as to be connected to the coil 59. Thus, a variable delay line DL1c is constituted. In FIG. 7, the reference numeral 79 denotes a ground side intermediate electrode formed on the base board 67, while 81 is a connection piece connecting the ground electrode 73 of the composite capacitor 77 with the ground side intermediate electrode 79.

In this variable delay line DL1c, the one 69a of the intermediate electrodes 69a through 69f which is on one end of the row thereof serves as the first output end 13c, while the one 69f of said intermediate electrodes 69a through 69f which is on the other end of the row thereof serves as the second output end 15c.

On the base board 67, an input circuit 9c is formed along but somewhat spaced apart from the other ends of the intermediate electrodes 69a through 69f, and an input point selection device 1c is constituted by allowing selective connection of the input circuit to one or another of the intermediate electrodes 69a through 69f by a connection piece 11d. Thus, in this variable delay line DL1c, by moving the connection piece 11d, thus to be positioned as the connection piece 11e shown by broken lines in FIG. 7, the delay times of the output signals from the first output end 13c and the second output end 15c are varied in a step wise manner.

In the above described variable delay line systems according to the present invention, as a matter of course, the fixed delay line DL2 may be connected to the first output ends 13, 13a, 13b, and 13c of the variable delay lines DL1, DL1a, DL1b, and DL1c.

Further, according to the variable delay line system of the present invention, it is possible to omit the fixed delay line DL2 by directly connecting the second output end 15 of the variable delay line DL1 to the AND gate B, as shown by the broken line 83 in FIG. 1, and to make the output ends 13 and 15 of the variable delay line DL1 switchable. And this same concept can be also applied to the other embodiments disclosed.

Although the above described embodiments made use of a signal switching means 2 incorporating the gate circuits A and B and the invertor circuit I, as an alternative it is possible to make up the signal switching means 2 from mechanical switches such as dip switches.

Figure 8:
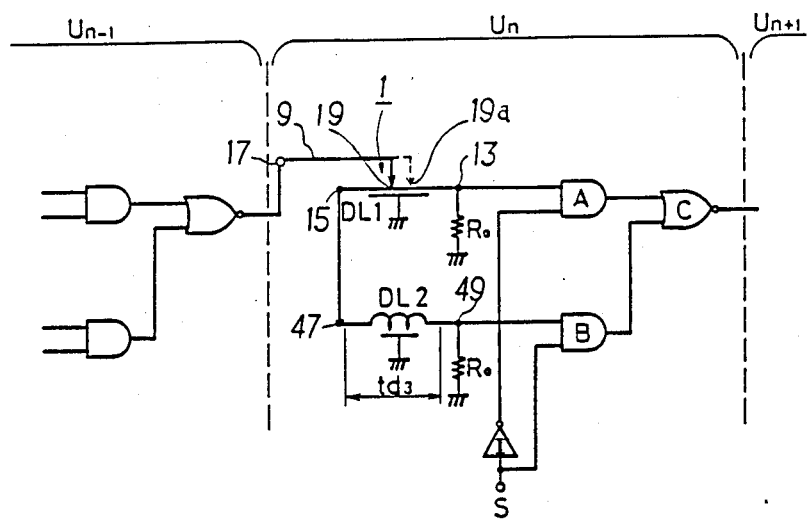
FIG. 8 is a circuit diagram for the fifth preferred embodiment of the variable delay line system of the present invention, the delay time provided by which is controllable by a digital control signal.

Now, FIG. 8 is a circuit diagram showing a fifth preferred embodiment of the variable delay line system of the present invention. Here, the delay time can be varied by a digital control signal which controls a programmable delay line.

In this programmable delay line, a number Q of variable delay line devices are connected in series using the variable delay line device of FIG. 1 as one block. Specifically, in the nth block Un, the input portion 17 of the input point selection device 1 is connected to the output of the preceding stage, and the output of the NOR gate C is connected to the input of the succeeding stage. The rest are connected similarly.

Signals having a relative time difference are switchably produced in the block Un according to the high and low levels of a digital control signal S, and the delay time of the signal of the programmable delay line as a whole can be digitally varied according to the combination of Q bit delay digital signals, using each of the binary digital signals for each block Un as one bit thereof.

Although the present invention has been shown and described in terms of certain preferred embodiments, and with reference to the appended drawings, it should not be considered as being particularly limited thereby, since the details could be varied without departing from the concept of the invention. Accordingly, the scope of the present invention is to be delimited solely by the following claims.

What is claimed is:
1. A variable delay line system, comprising:
   a variable delay line comprising an insulating base board, an electroconductive strip formed on one surface thereof, and a ground plane formed on the other surface thereof, said electroconductive strip having two output ends and a plurality of input points defined therealong;

selection means for selecting one of said input points of said variable delay line and for inputting a signal thereto, comprising an input circuit formed on said base board along and spaced apart from said electroconductive strip, and a connecting piece which selectively connects said input circuit to one of said input points; and switching means for selectively switching a signal from one of said output ends and outputting said signal.

2. A variable delay line system according to claim 1, wherein said electroconductive strip is substantially linearly formed.

3. A variable delay line system according to claim 1, wherein both said electroconductive strip and said input circuit are formed in a convoluted manner, said input circuit being located adjacent the electroconductive strip and spaced apart at an essentially constant distance therefrom.

4. A variable delay line system as claimed in claim 1, wherein said electroconductive strip is formed in a convoluted manner and said input circuit is substantially linearly formed, said input circuit being located adjacent to portions of the electroconductive strip and spaced apart at an essentially constant distance therefrom.

5. A variable delay line system according to claim 4, further comprising a short circuiting piece which connects together points on said electroconductive strip.

6. A variable delay line system, comprising:

a variable delay line comprising an insulating base board, a plurality of electrodes arranged on said insulating base board, a coil formed by winding a conductive wire as a single layered solenoid, said coil having two output ends and a plurality of intermediate taps connected to the plurality of electrodes, and a capacitor connected to said intermediate taps via said electrodes;

selection means for selecting one of said electrodes and for inputting a signal thereto, comprising an input circuit formed on said base board along and spaced apart from said electrodes, and a connecting piece which selectively connects the input circuit to one of said electrodes; and switching means for selectively switching a signal from one of said output ends and outputting said signal.

7. A variable delay line system, comprising:

a variable delay line comprising an insulating base board, an electroconductive strip formed on one surface thereof, and a ground plane formed on the other surface thereof, said electro conductive strip having two output ends and a plurality of input points defined therealong;

selection means for selecting one of said input points of said variable delay line and for inputting a signal thereto, comprising an input circuit formed on said base board along and spaced apart from said electroconductive strip, and a connecting piece which selectively connects said input circuit to one of said input points;

a fixed delay line which is connected in series with one of said output ends of the electroconductive strip, said fixed delay line having an output end, and switching means for selectively switching a signal from either the other output end of the electroconductive strip or the output end of the fixed delay line, and outputting said signal.

8. A variable delay line system according to claim 7 wherein said electroconductive strip is substantially linearly formed.

9. A variable delay line system according to claim 7, wherein both said electroconductive strip and said input circuit are formed in a convoluted manner, said input circuit being located adjacent the electroconductive strip and spaced apart at an essentially constant distance therefrom.

10. A variable delay line system according to claim 7, wherein said electroconductive strip is formed in a convoluted manner and said input circuit is substantially linear formed, said input circuit being located adjacent portions of the electroconductive strip and spaced apart at an essentially constant distance therefrom.

11. A variable delay line system according to claim 10, further comprising a short circuiting piece which connects together points on said electroconductive strip.

12. A variable delay line system, comprising:

a variable delay line comprising an insulating base board, a plurality of electrodes arranged on said insulating base board, a coil formed by winding a conducting wire as a single layered solenoid, said coil having two output ends and a plurality of intermediate taps connected to the plurality of electrodes, and a capacitor connected to said intermediate taps via said electrodes;

selection means for selecting one of said electrodes and for inputting a signal thereto, comprising an input circuit formed on said base board along and spaced apart from said electrodes, and a connecting piece which selectively connects the input circuit to one of said electrodes;

a fixed delay line which is connected in series with one of said output ends of the coil, said fixed delay line having an output end; and switching means for selectively switching a signal from either the other output end of the coil or the output end of the fixed delay line, and outputting said signal.

* * * * *